(12) United States Patent
Park et al.

(10) Patent No.: US 7,291,439 B2
(45) Date of Patent: Nov. 6, 2007

(54) PHOTORESIST COMPOSITION, METHOD FOR FORMING FILM PATTERN USING THE SAME, AND METHOD FOR MANUFACTURING THIN FILM TRANSISTOR ARRAY PANEL USING THE SAME

(75) Inventors: Jeong-Min Park, Seoul (KR); Hi-Kuk Lee, Yongin-si (KR); Jin-Ho Ju, Seoul (KR); Woo-Seok Jeon, Seoul (KR); Doo-Hee Jung, Seoul (KR); Dong-Min Kim, Suwon (KR); Ki-Sik Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/483,794

(22) Filed: Jul. 7, 2006

(65) Prior Publication Data

US 2007/0009833 A1    Jan. 11, 2007

(30) Foreign Application Priority Data

Jul. 8, 2005    (KR)    .................... 10-2005-0061606

(51) Int. Cl.
*G03F 7/004* (2006.01)
(52) U.S. Cl. .................... 430/191; 430/192; 430/193; 438/148; 438/149; 438/155; 438/161
(58) Field of Classification Search ............... 430/191, 430/192, 193; 438/148, 149, 155, 161
See application file for complete search history.

(56) References Cited

U.S. PATENT DOCUMENTS

| | | | | |
|---|---|---|---|---|
| 4,514,253 A | * | 4/1985 | Minezaki | .................... 438/102 |
| 5,407,779 A | * | 4/1995 | Uetani et al. | ................ 430/192 |
| 5,853,948 A | * | 12/1998 | Sawano et al. | ............. 430/166 |
| 5,912,102 A | * | 6/1999 | Kawata et al. | .............. 430/191 |
| 6,120,969 A | * | 9/2000 | Hagihara et al. | ........... 430/191 |
| 6,177,226 B1 | * | 1/2001 | Kurihara et al. | ............ 430/191 |
| 6,380,006 B2 | * | 4/2002 | Kido | .......................... 438/149 |
| 7,119,022 B2 | * | 10/2006 | Uehara et al. | .............. 438/713 |

FOREIGN PATENT DOCUMENTS

| | | |
|---|---|---|
| JP | 2003-167259 | 6/2003 |
| JP | 2004-177683 | 6/2004 |
| JP | 2005-049667 | 2/2005 |
| KR | 0209425 | 4/1999 |
| KR | 0237684 | 10/1999 |
| KR | 2001-104263 | 11/2001 |
| KR | 0341122 | 4/2002 |
| KR | 2002-066573 | 8/2002 |
| KR | 2002-071643 | 9/2002 |

* cited by examiner

*Primary Examiner*—John S. Chu
(74) *Attorney, Agent, or Firm*—MacPherson Kwok Chen & Heid LLP; David S. Park

(57) ABSTRACT

A photoresist composition, a method for forming a film pattern using the photoresist composition, and a method for manufacturing a thin film transistor array panel using the photoresist composition are provided. In one embodiment, a photoresist composition includes an alkali-soluble resin, a photosensitive compound, and an additive, for advantageously providing a uniform photoresist in a channel region.

12 Claims, 22 Drawing Sheets

PHOTORESIST COMPOSITION, METHOD FOR FORMING FILM PATTERN USING THE SAME, AND METHOD FOR MANUFACTURING THIN FILM TRANSISTOR ARRAY PANEL USING THE SAME

CROSS-REFERENCE TO RELATED APPLICATION

This application claims priority to and the benefit of Korean Patent Application No. 10-2005-0061606 filed in the Korean Intellectual Property Office on Jul. 08, 2005, the entire contents of which are incorporated herein by reference.

BACKGROUND (a) Field of the Invention

The present invention relates to a photoresist composition, a method for forming a film pattern using the same, and a method for manufacturing a thin film transistor array panel using the same.

(b) Description of the Related Art

A liquid crystal display (LCD) is one of commonly used flat panel- displays. An LCD includes two panels having a pixel electrode and a common electrode respectively, and a liquid crystal layer interposed between these panels. Generally, the pixel electrodes are disposed on one of the panels and arranged in a matrix shape. The common electrode is disposed on the other of the panels and covers substantially the entire surface thereof. A pixel electrode and the common electrode are supplied with a data voltage and a common voltage, respectively, to generate an electric field in the liquid crystal layer. The electric field changes the orientations of liquid crystal molecules, which in turn changes transmittance of incident light to display an image.

In order to apply respective voltages to the pixel electrodes, switching elements such as thin film transistors (TFTs) having three terminals are separately connected to the pixel electrodes. The panel having the pixel electrodes and TFTs (referred to as "TFT array panel" hereinafter) includes a plurality of gate lines transmitting control signals for the TFTs and a plurality of data lines transmitting data voltages. Each of the TFTs transmits or blocks data signals for a pixel electrode from a data line in response to a scanning signal from a gate line. The switching elements such as TFTs are also included in active matrix organic light emitting diode displays (OLEDs). The TFT separately controls each light emitting diode.

The TFT array panel includes a plurality of thin films such as a gate layer, a data layer, and a semiconductor layer. The thin films are respectively patterned by photolithography processes using separate photo masks. However, when an additional mask is added, various process steps such as light-exposure, development, and etching are required, and accordingly manufacturing time and cost significantly increase. Therefore, it is preferable to decrease the number of masks required during processing.

To pattern the data layer and the semiconductor layer, it has been suggested to use one photo mask having a slit pattern, in which a channel portion of a TFT is formed between a source electrode and a drain electrode of the TFT using the slit pattern of the photo mask. However, using such a method, photoresist remaining in the channel portion may be non-uniform, and therefore the semiconductor layer in the channel portion may be non-uniformly etched. Further, the data layer can be over-etched, causing the semiconductor layer under the data layer to be broadly exposed near the edges thereof. The exposed portions of the semiconductor layer unnecessarily reduce the aperture ratio of an LCD.

The above information disclosed in this Background section is only for enhancement of understanding of the background of the invention and therefore it may contain information that does not form the prior art that is already known in this country to a person of ordinary skill in the art.

SUMMARY

The present invention causes photoresist remaining in the channel portion to be uniform and reduces the projections of a semiconductor layer.

A photoresist composition according to an embodiment of the present invention includes an alkali-soluble resin and a photosensitive compound having a ballast structure of Chemical Formula (I):

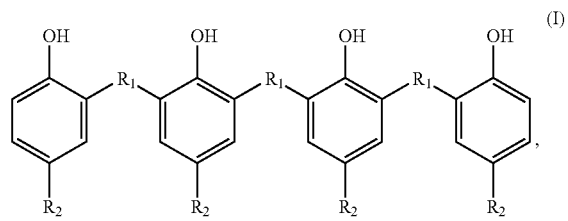

where $R_1$ and $R_2$ are alkyl groups, and $R_1$ and $R_2$ may be the same or different.

A photoresist composition according to an embodiment of the present invention includes an alkali-soluble resin, a photosensitive compound, and an additive for modulating heat resistance including at least one of a first compound expressed by Chemical Formula (II) and a second compound expressed by Chemical Formula (III):

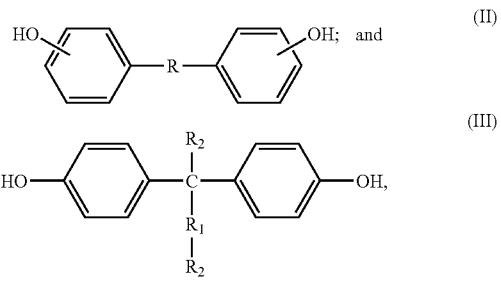

where R is a methyl group, an ethyl group, or a propyl group, $R_1$ is a methyl group, an ethyl group, a propyl group, a butyl group, a pentyl group, or a hexyl group, and $R_2$ is hydrogen or a methyl group.

A method of forming a film pattern according to an embodiment of the present invention includes: depositing a conductive or nonconductive film on a substrate; coating a photoresist composition including an alkali-soluble resin and a photosensitive compound having a ballast structure of Chemical Formula (I); light-exposing and developing the photoresist composition to form a masking member; and etching the film using the masking member.

A method of manufacturing a thin film transistor array panel according to an embodiment of the present invention includes: forming a gate line including a gate electrode on a substrate; depositing a gate insulating layer and a semiconductor layer on the gate line; depositing a data layer on the semiconductor layer; coating a photoresist composition including an alkali-soluble resin and a photosensitive compound having a ballast structure of Chemical Formula (I) on the data layer; light-exposing and developing the photoresist composition to form a first photoresist member; etching the data layer using the first photoresist member to form a data conductor; applying heat-treatment for reflow to the first photoresist member to form a second photoresist member; and etching the data conductor using the second photoresist member.

A method of manufacturing thin film transistor array panel according to an embodiment of the present invention includes: forming a gate line including a gate electrode on a substrate; depositing a gate insulating layer and a semiconductor layer on the gate line; depositing a data layer on the semiconductor layer; coating a photoresist composition on the data layer; light-exposing the photoresist composition; developing the light-exposed photoresist composition to form a first photoresist member including a first portion and a second portion that is thinner than the first portion; etching the data layer using the first photoresist member to form a data conductor; etching the semiconductor layer using the data conductor; applying heat-treatment for reflow to the first photoresist member to form a second photoresist member; and etching the data conductor using the second photoresist member. There is no heat-treatment between the development of the light-exposed photoresist film and the etching of the data layer.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The present invention will become more apparent by describing embodiments thereof in detail with reference to the accompanying drawings, in which.

Figure 1:
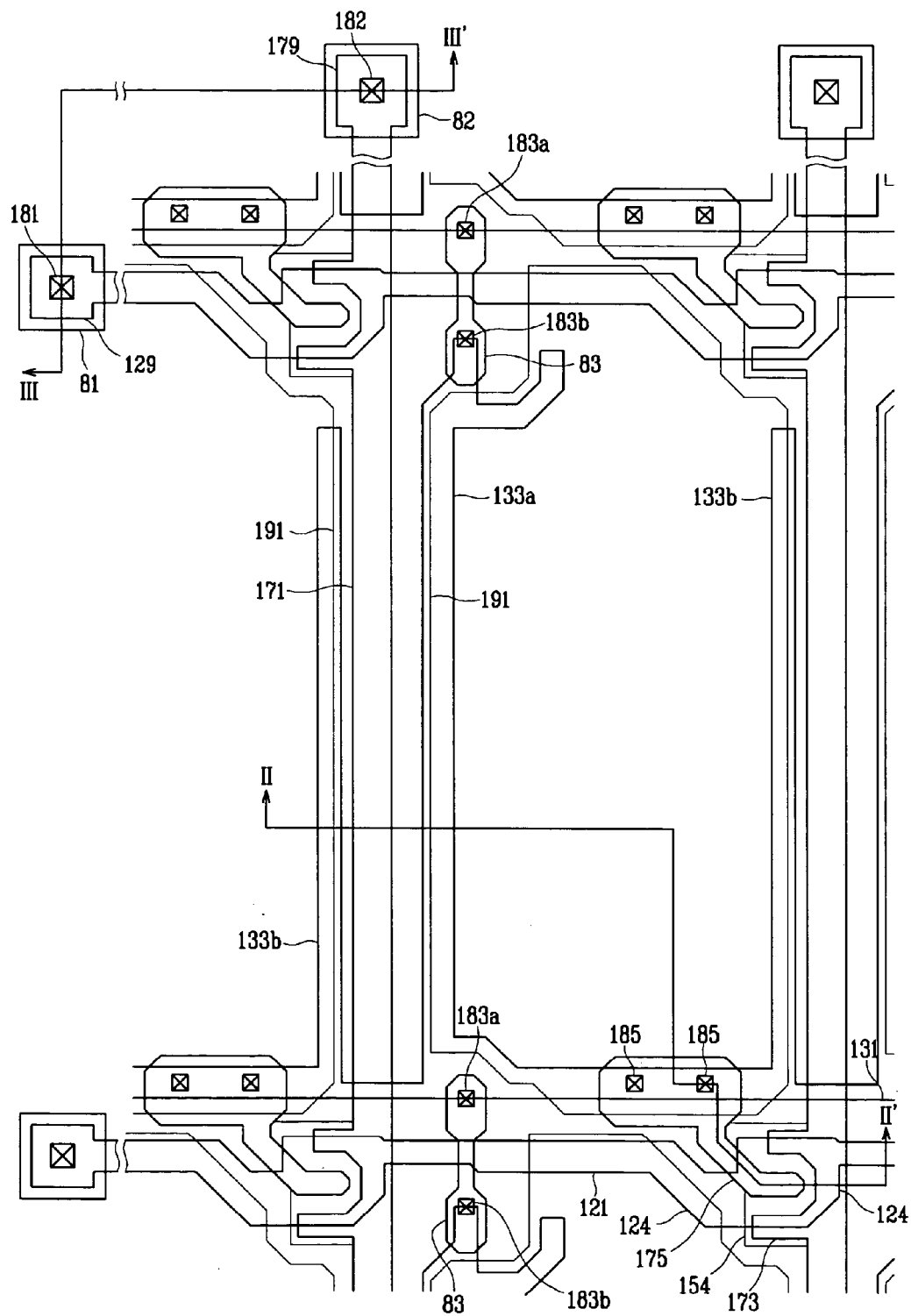
FIG. 1 is a layout view of a TFT array panel according to an embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

The present invention now will be described more fully hereinafter with reference to the accompanying drawings, in which embodiments of the invention are shown. The present invention may, however, be embodied in many different forms and should not be construed as limited to the embodiments set forth herein.

A photoresist composition according to an embodiment of the present invention includes an alkali-soluble resin and a photosensitive compound.

The alkali-soluble resin may include novolac resin. The novolac resin may be obtained by reaction of a phenol monomer and an aldehyde under an acid catalyst. The phenol monomer may be obtained by synthesis of a meta (m)-cresol of Chemical Formula (IV) and a para(p)-cresol of Chemical Formula (V) in a predetermined ratio;

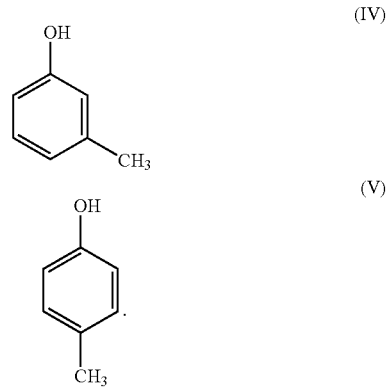

The aldehyde is one or more selected from formaldehyde, p-formaldehyde, benzaldehyde, nitrobenzaldehyde, and acetaldehyde. The acid catalyst for the reaction of the phenol monomer and the aldehyde is one or more selected from hydrochloric acid, nitric acid, sulfuric acid, formic acid, and oxalic acid. The average molecular weight of the novolac resin may be from about 2000 to about 5000. The photoresist including the above-described novolac resin may have a good reflow characteristic and adhesion, and be appropriate to form a fine pattern. When the average molecular weight of the novolac resin is less than about 2,000, sensitivity of the photoresist is reduced such that it is not easy to form a fine pattern using the photoresist. When the average molecular weight of the novolac resin is greater than 5,000, the reflow characteristic and the adhesion of the photoresist may be reduced. The weight percentage of the alkali-soluble resin in the photoresist composition may be from about 5 wt % to about 30 wt % in one example.

The photosensitive compound photo-chemically reacts when exposed to light. The photosensitive compound may have a ballast structure expressed by Chemical Formula (I):

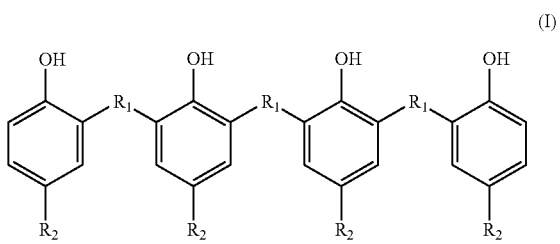

(I)

where $R_1$ and $R_2$ are alkyl groups, and $R_1$ and $R_2$ may be the same or different. The ballast structure has alkyl groups connected between a plurality of benzene rings as shown in Chemical Formula (I), so the compound having the ballast structure is caused to be flexible and fluidity of the photoresist including the compound may be increased. In one example, a hydroxy group (—OH) of the ballast structure may combined with a diazide group such as a quinone diazide to be photo-sensitive. The ballast structure combined with a diazide group may be 2,2'-methylene bis[6-(2-hydroxy-5-methyl phenyl)methyl]-4-methyl-1,2-naphtoquinonediazide-5-sulfonate.

The weight percentage of the photosensitive compound in the photoresist composition may be from about 2 wt % to about 10 wt %. When the amount of the photosensitive compound is less than about 2 wt %, the sensitization speed of the photoresist is reduced when exposed. When the amount of the photosensitive compound is greater than 10 wt %, the sensitization speed of the photoresist is rapidly increased to cause a profile of the photoresist to be poor.

The photoresist composition according to an embodiment of the present invention may further include an additive for modulating heat resistance. The additive for modulating heat resistance reduces heat resistance of the photoresist, and thus causes the photoresist to reflow at a low temperature. The additive for modulating heat resistance includes a first bisphenol group compound of Chemical Formula (II) or a second bisphenol group compound of Chemical Formula (III):

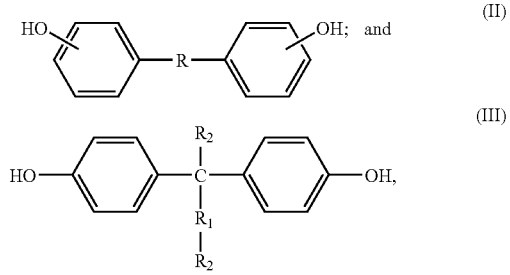

where R is a methyl group, an ethyl group, or a propyl group, $R_1$ is a methyl group, an ethyl group, a propyl group, a butyl group, a pentyl group, or a hexyl group, and $R_2$ is hydrogen or a methyl group. The weight percentage of the additive for modulating heat resistance in the photoresist composition may be from about 0.5 wt % to about 3 wt %.

The photoresist composition may further include plasticizers, stabilizers, or a surfactant in addition to the composition described above.

The alkali-soluble resin, the photosensitive compound, and the additives are dissolved in an organic solvent to be used in a solution. The organic solvent may be selected from ethyl acetate, butyl acetate, diethylene glycol dimethyl ether, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethyl formamide, N,N-dimethyl acetamide, N-methyl-2-pyrolidone, γ-butyrolactone, diethyl ether, ethylene glycol dimethyl ether, diglyme, tetrahydrofurane, methanol, ethanol, propanol, isopropanol, methyl cellosolve, ethyl cellosolve, diethylene glycol methyl ether, diethylene glycol ethyl ether, dipropylene glycol methyl ether, toluene, xylene, hexane, heptane, and octane. The weight percentage of the solvent in the photoresist composition may be from about 60 wt % to about 90 wt % in one example.

Now, experimental examples regarding sensitivity, adhesion, and heat resistance of a photoresist according to an embodiment of the present invention will be described. The experimental examples are intended only to illustrate the present invention, and thus the present invention is not limited thereto.

EXPERIMENTAL EXAMPLE 1

Formation of Photoresist Composition

A novolac resin having a molecular weight of 4,000 was obtained from a composition product of 60 parts by weight of m-cresol and 40 parts by weight of p-cresol. The novolac resin was mixed with a photosensitive compound such as 20 parts by weight of 2,2'-methylene bis[6-(2-hydroxy-5-methyl phenyl)methyl]-4-methyl-1,2-naphtoquinonediazide-5-sulfonate. The mixture was dissolved in propylene glycol monomethylether acetate to be of a solid density of 30 parts by weight and filtered using a 0.2 μm millipore filter to obtain the photoresist composition.

Lithography

A photoresist pattern was formed by using the obtained photoresist composition. A glass substrate was prepared and a Mo film was deposited on the substrate. The photoresist compositions were spin-coated on the Mo film to form a photoresist film.

Without heat-treatment, the photoresist film was exposed to UV light having multiple wavelengths of 365 nm, 405 nm, and 436 nm with intensities of 12 mW/cm$^2$, 45 mW/cm$^2$, and 28 mW/cm$^2$, respectively, for five seconds through a mask. The photoresist film was dipped in 2.38 wt % aqueous solution of tetramethyl ammonium hydroxide (TMAH) for one minute at about 25° C. and cleaned with pure water for one minute to obtain a photoresist pattern.

EXPERIMENTAL EXAMPLE 2

A novolac resin having a molecular weight of 3,000 was obtained from a composition product of 60 parts by weight of m-cresol and 40 parts by weight of p-cresol. The novolac resin was mixed with a photosensitive compound such as 23 parts by weight of 2,2'-methylene bis[6-(2-hydroxy-5-methyl phenyl)methyl]-4-methyl-1,2-naphtoquinonediazide-5-sulfonate. The mixture was treated under substantially the same process conditions as described above with respect to Experimental Example 1 to obtain a photoresist composition.

A photoresist pattern was formed from the obtained photoresist composition using substantially the same processes as in Experimental Example 1.

EXPERIMENTAL EXAMPLE 3

A photoresist composition was obtained from a mixture including an additive for modulating heat resistance such as 2 parts by weight of methylene bisphenol in addition to the novolac resin and the photosensitive compound described in Experimental Example 2 using substantially the same processes as in Experimental Example 2.

A photoresist pattern was formed from the obtained photoresist composition using substantially the same processes as in Experimental Example 1.

EXPERIMENTAL EXAMPLE 4

Photoresist composition was obtained from a mixture including an additive for modulating heat resistance such as 2 parts by weight of 4,4'-(1-methyl heptylidene)bisphenol in addition to the novolac resin and the photosensitive compound described in Experimental Example 2 using substantially the same processes as in Experimental Example 2.

A photoresist pattern was formed from the obtained photoresist composition using substantially the same processes as in Experimental Example 1.

COMPARATIVE EXAMPLE

A photoresist composition was obtained using substantially the same processes as in Experimental Example 1 from a mixture including a novolac resin having a molecular weight of 6,000 obtained from a composition product of 60 parts by weight of m-cresol and 40 parts by weight of p-cresol and a photosensitive compound such as 18 parts by weight of 2,3,4,4'-tetrahydroxy benzophenone-1,2-naphtoquinonediazide-5-sulfonate and 2,3,4-tetrahydroxy benzophenone-1,2-naphtoquinonediazide-5-sulfonate composed in the weight ratio of 50:50.

A photoresist pattern was formed from the obtained photoresist composition using substantially the same processes as in Experimental Example 1.

Experimental Result

In order to measure sensitivity, adhesion, and heat resistance of photoresists, experiments were carried out as follows.

The gamma values of the photoresists were measured in order to compare sensitivity of the photoresists according to the photoresist compositions after exposing the photoresist films to light through a mask and developing the light-exposed photoresist films.

In order to compare adhesion of the photoresists according to the photoresist compositions, the Mo films uncovered by the photoresist patterns were wet-etched using the photoresist patterns as etching masks to form Mo patterns, and then the length of the Mo patterns eliminated by the etchant in the portion covered by the photoresist patterns was measured.

The slope of the edge surfaces of the photoresist patterns, which were sloped relative to the surface of the substrate with an inclination angle θ, was measured after applying heat-treatment to the photoresist patterns at 140° C. in order to compare heat resistance of the photoresists.

The experimental results are shown in Table 1.

TABLE 1

| | Gamma value (mJ/cm$^2$) | Eliminated-length (nm) | Slope (tan θ) |
|---|---|---|---|
| Experimental Example 1 | 37.0 | 425 | 31 |
| Experimental Example 2 | 35.5 | 395 | 29 |
| Experimental Example 3 | 34.0 | 485 | 27 |
| Experimental Example 4 | 33.0 | 470 | 28 |
| Comparative Example | 35.0 | 529 | 39 |

TABLE 1 shows that the sensitivity of the photoresists in the experimental examples was similar to that in the comparative example. As shown in TABLE 1, the adhesion of the photoresists in the experimental examples was better than that in the comparative example.

In detail, the photoresist in the experimental examples had smaller amounts of the novolac resin than the photoresist in the comparative example, and the length of the Mo patterns eliminated by etchant in the portion covered by the photoresist patterns in the experimental examples was shorter than that in the comparative example. Accordingly, the adhesion of the photoresist including the novolac resin decreases depending on a decreasing amount of the included novolac resin.

The photoresist patterns in the experimental examples, which were sloped relative to the surface of the substrate, were less inclined than the photoresist patterns in the comparative example after heat-treatment. This means that the photoresist patterns in the experimental examples are more fluent, namely they have lower heat resistance, than the photoresist patterns in the comparative example in the same heat-treatment conditions.

In detail, the heat resistance of the photoresist decreases depending on a decrease of the novolac resin, and the photoresist including the additive for modulating heat resistance according to the experimental example 3 and 4 has a lower heat resistance than the photoresists according to the other examples.

As described above, the photoresist composition according to an embodiment of the present invention, which includes the novolac resin (Mw=about 2000 to about 5000) and the additive for modulating heat resistance, has not only good adhesion and fluidity but also preserves good sensitivity.

Now, thin film transistor (TFT) array panels for a liquid crystal display (LCD) including an insulating layer made from the above-described photoresist composition and manufacturing methods thereof are described in detail with reference to accompanying drawings.

As those skilled in the art will realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a thin film transistor (TFT) array panel according to an embodiment of the present invention will be described in detail with reference to FIGS. 1 to 3.

Figure 2:
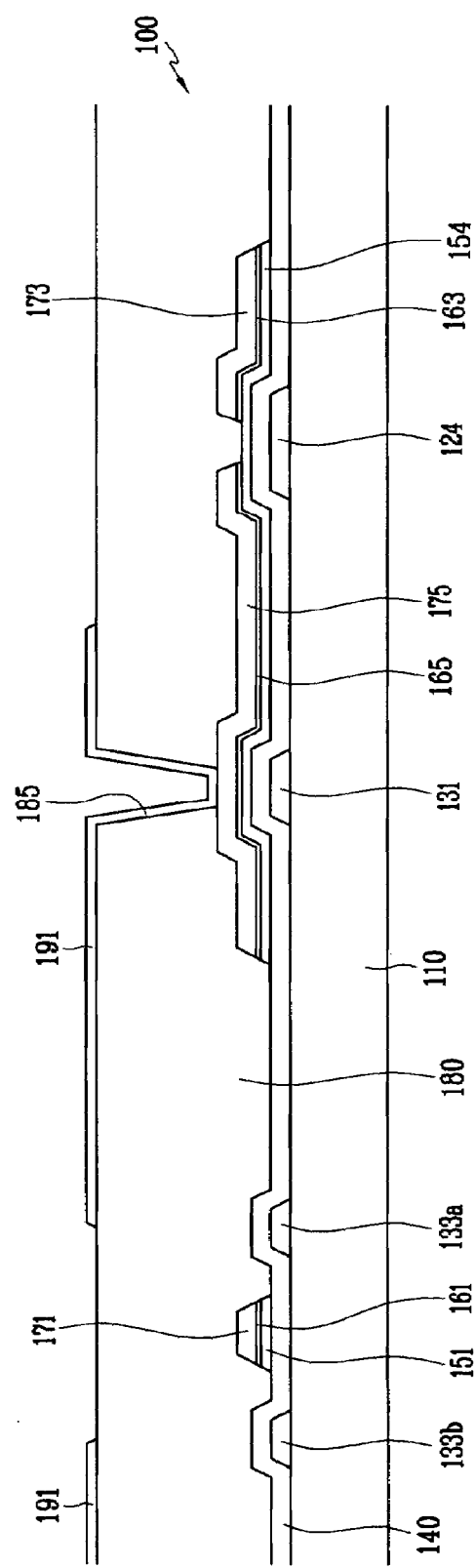
FIG. 2 and FIG. 3 are sectional views of the TFT array panel shown in FIG. 1 taken along line II-II' and line III-III', respectively.
Figure 3:
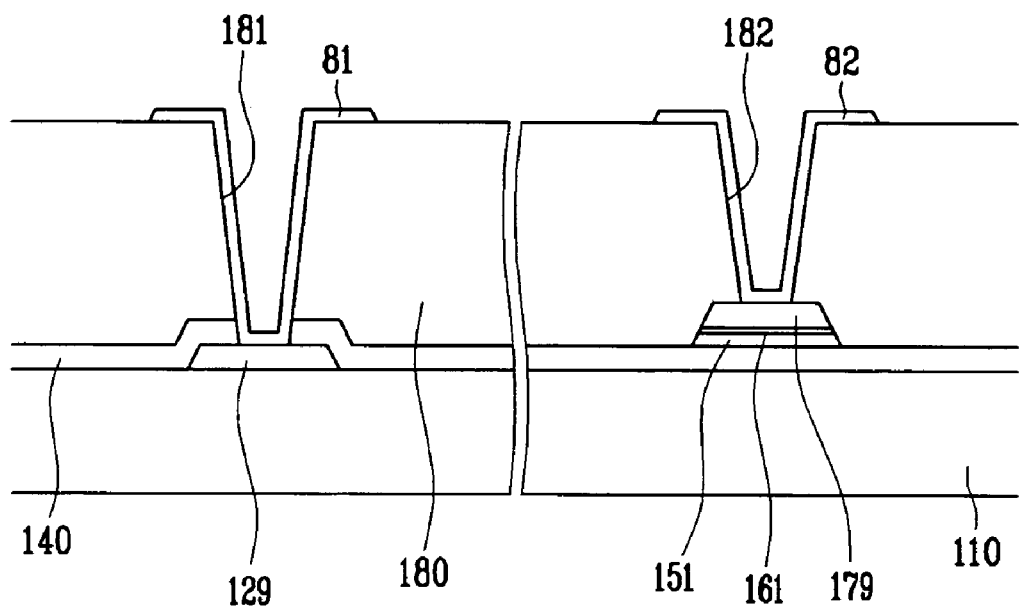

FIG. 1 is a layout view of a TFT array panel according to an embodiment of the present invention, FIG. 2 is a sectional view of the TFT array panel shown in FIG. 1 taken along line II-II', and FIG. 3 is a sectional view of the TFT array panel shown in FIG. 1 taken along line III-III'.

A plurality of gate lines 121 and a plurality of storage electrode lines 131 are formed on an insulating substrate 110 such as transparent glass or plastic.

The gate lines 121 transmit gate signals and extend substantially in a transverse direction. Each of the gate lines 121 includes a plurality of gate electrodes 124 projecting downward and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121 may extend to be connected to a driving circuit that may be integrated on the substrate 110.

The storage electrode lines 131 are supplied with a predetermined voltage, and each of the storage electrode lines 131 includes a stem extending substantially parallel to the gate lines 121 and a plurality of pairs of first and second storage electrodes 133a and 133b branched from the stem. Each of the storage electrode lines 131 is disposed between two adjacent gate lines 121 and the stem is proximate to one of the two adjacent gate lines 121. Each of the storage electrodes 133a and 133b has a fixed end portion connected to the stem and a free end portion disposed opposite thereto. The fixed end portion of the first storage electrode 133a has a large area, and the free end portion thereof is bifurcated into a linear branch and a curved branch. However, the storage electrode lines 131 may have various shapes and arrangements.

The gate lines 121 and storage electrode lines 131 may be made of an Al-containing metal such as Al or an Al alloy, a Ag-containing metal such as Ag or a Ag alloy, a Cu-containing metal such as Cu or a Cu alloy, a Mo-containing metal such as Mo or a Mo alloy, a Cr-containing metal or a Cr alloy, a Ta-containing metal or a Ta alloy, or a Ti-containing metal or a Ti alloy. However, the lines may also have a multi-layered structure including two conductive films (not shown) having different physical characteristics. One of the two films may be made of a low resistivity metal such as an Al-containing metal, a Ag-containing metal, or a Cu-containing metal for reducing signal delay or voltage drop. The other film may be made of a material such as a Mo-containing metal, a Cr-containing metal, a Ta-containing metal, a Ti-containing metal, or alloys thereof, which has good physical, chemical, and electrical contact characteristics with other materials such as indium tin oxide (ITO) or indium zinc oxide (IZO). Examples of the combination of the two films are a lower Cr film and an upper Al (alloy) film and a lower Al (alloy) film and an upper Mo (alloy) film. However, the gate lines 121 and the storage electrode lines 131 may be made of various metals or conductors.

The lateral sides of the gate lines 121 and the storage electrode lines 131 are inclined relative to a surface of the substrate 110, and the inclination angle thereof ranges from about 30 degrees to about 80 degrees in one example.

A gate insulating layer 140 preferably made of silicon nitride (SiNx) or silicon oxide (SiOx) is formed on the gate lines 121 and the storage electrode lines 131.

A plurality of semiconductor stripes 151 preferably made of hydrogenated amorphous silicon (abbreviated to "a-Si") or polysilicon are formed on the gate insulating layer 140. Each of the semiconductor stripes 151 extends substantially in the longitudinal direction and includes a plurality of projections 154 branched out toward the gate electrodes 124. The semiconductor stripes 151 become relatively wider near the gate lines 121 and the storage electrode lines 131 such that the semiconductor stripes 151 cover large areas of the gate lines 121 and the storage electrode lines 131.

A plurality of ohmic contact stripes and islands 161 and 165 are formed on the semiconductor stripes 151. The ohmic contacts 161 and 165 are preferably made of n+hydrogenated a-Si heavily doped with an n-type impurity such as phosphorous or they may be made of silicide. Each of the ohmic contact stripes 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are preferably in a range from about 30 degrees to about 80 degrees in one example.

A plurality of data lines 171 and a plurality of drain electrodes 175 are formed on the ohmic contacts 161 and 165.

The data lines 171 transmit data signals and extend substantially in the longitudinal direction to intersect the gate lines 121. Each of the data lines 171 also intersects the storage electrode lines 131 and runs between adjacent pairs of storage electrodes 133a and 133b. Each data line 171 includes a plurality of source electrodes 173 projecting toward the gate electrodes 124 and an end portion 179 having a large area for contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite to the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may be made of a refractory metal such as Cr, Mo, Ta, Ti, or alloys thereof. However, they may have a multilayered structure including a refractory metal film (not shown) and a low resistivity film (not shown). Examples of the multi-layered structure are a double-layered structure including a lower Cr/Mo (alloy) film and an upper Al (alloy) film, and a triple-layered structure of a lower Mo (alloy) film, an intermediate Al (alloy) film, and an upper Mo (alloy) film.

However, the data lines 171 and the drain electrodes 175 may be made of various metals or conductors.

The data lines 171 and the drain electrodes 175 have inclined edge profiles, and the inclination angles thereof range from about 30 degrees to about 80 degrees in one example.

The ohmic contacts 161 and 165 are interposed only between the underlying semiconductor stripes 151 and the overlying conductors 171 and 175 thereon, and reduce the contact resistance therebetween.

The semiconductor stripes 151 have similar planar shapes as the data lines 171 and the drain electrodes 175 as well as the underlying ohmic contacts 161 and 165, except for the projections 154 on which TFTs are formed. That is, the semiconductor stripes 151 are formed under the data lines 171 and the drain electrodes 175, and the underlying ohmic contacts 161, 163, and 165, and include some exposed portions that are not covered with the data lines 171 and the drain electrodes 175, such as portions located between the source electrodes 173 and the drain electrodes 175.

A passivation layer 180 is formed on the data lines 171, the drain electrodes 175, and the exposed portions of the semiconductor stripes 151. The passivation layer 180 may be made of an inorganic or organic insulator such as silicon nitride and silicon oxide, an organic insulator, or a low dielectric insulator, and it may have a flat top surface. The inorganic insulator and the organic insulator may have a dielectric constant less than about 4.0. Examples of the low dielectric insulator include a-Si:C:O and a-Si:O:F formed by plasma enhanced chemical vapor deposition (PECVD). The organic insulator may have photosensitivity. In one example, the passivation layer 180 may include a lower film of an inorganic insulator and an upper film of an organic insulator, such that it takes the excellent insulating characteristics of the organic insulator while preventing the exposed portions of the semiconductor stripes 151 from being damaged by the organic insulator.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121, a plurality of contact holes 183*a* exposing portions near the fixed end portions of the storage electrode 133*a*, and a plurality of contact holes 183*b* exposing portions of the free end portions of the storage electrode lines 131.

A plurality of pixel electrodes 191, a plurality of overpasses 83, and a plurality of contact assistants 81 and 82 are formed on the passivation layer 180. They are preferably made of a transparent conductor such as ITO or IZO or a reflective conductor such as Ag, Al, or alloys thereof.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 191 and the common electrode form a capacitor referred to as a "liquid crystal capacitor," which stores applied voltages after the TFT is turned off.

A pixel electrode 191 overlaps a storage electrode line 131 including storage electrodes 133*a* and 133*b*. The pixel electrode 191, a drain electrode 175 connected thereto, and the storage electrode line 131 form an additional capacitor referred to as a "storage capacitor," which enhances the voltage storing capacity of the liquid crystal capacitor.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

The overpasses 83 cross over the gate lines 121 and are connected to the exposed portions of the storage electrode lines 131 and the exposed linear branches of the free end portions of the storage electrodes 133*b* through a pair of the contact holes 183*a* and 183*b*, respectively, which are disposed opposite each other with respect to the gate lines 121. The storage electrode lines 131 including the storage electrodes 133*a* and 133*b* along with the overpasses 83 can be used for repairing defects in the gate lines 121, the data lines 171, or the TFTs.

Now, a method of manufacturing the TFT array panel shown in FIGS. 1 to 3 according to an embodiment of the present invention will be described in detail with reference to FIGS. 4 to 22 in conjunction with FIGS. 1 to 3.

Figure 4:
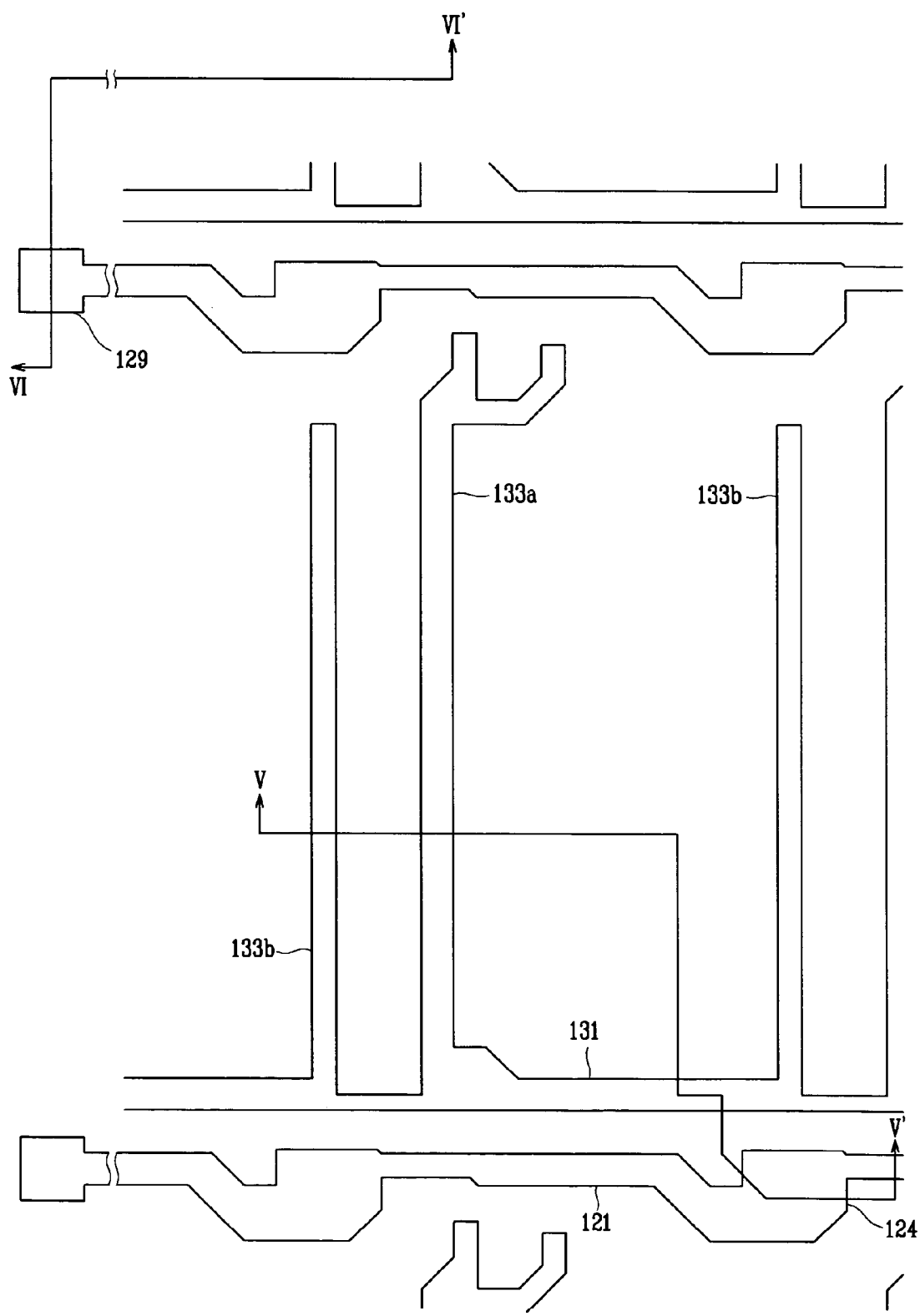
FIG. 4, FIG. 17, and FIG. 20 are layout views of a TFT array panel shown in FIG. 1 to FIG. 3 in steps of a manufacturing method thereof according to an embodiment of the present invention.
Figure 5:
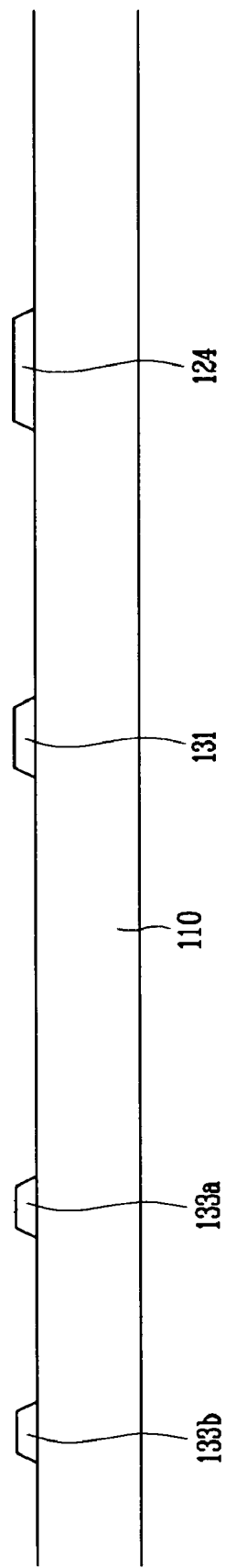
FIG. 5 and FIG. 6 are sectional views of the TFT array panel shown in FIG. 4 taken along line V-V' and line VI-VI', respectively.
Figure 6:
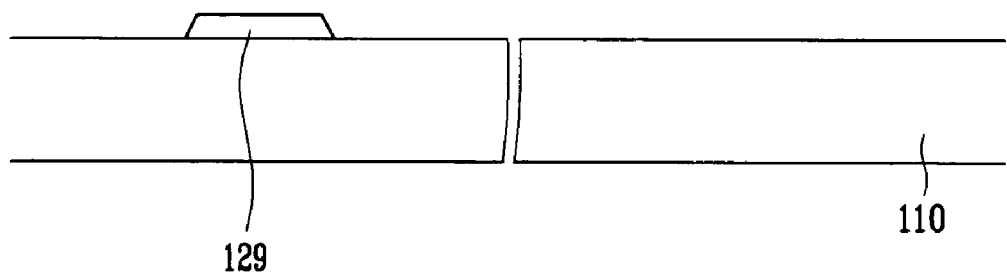
Figure 15:
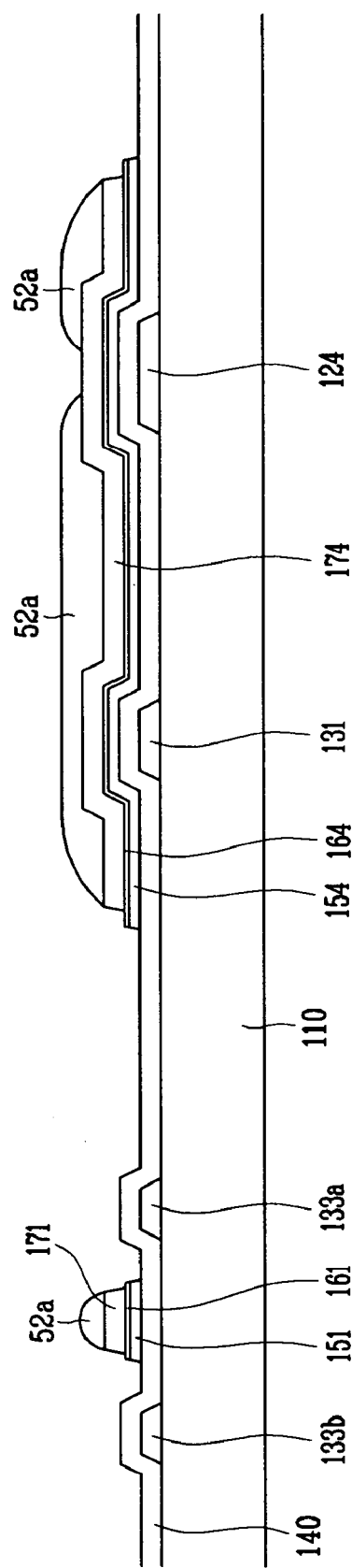
Figure 16:
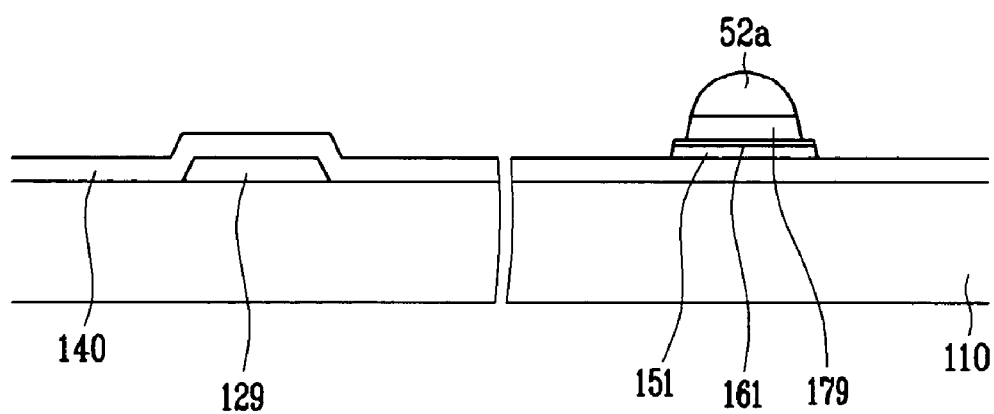
Figure 17:
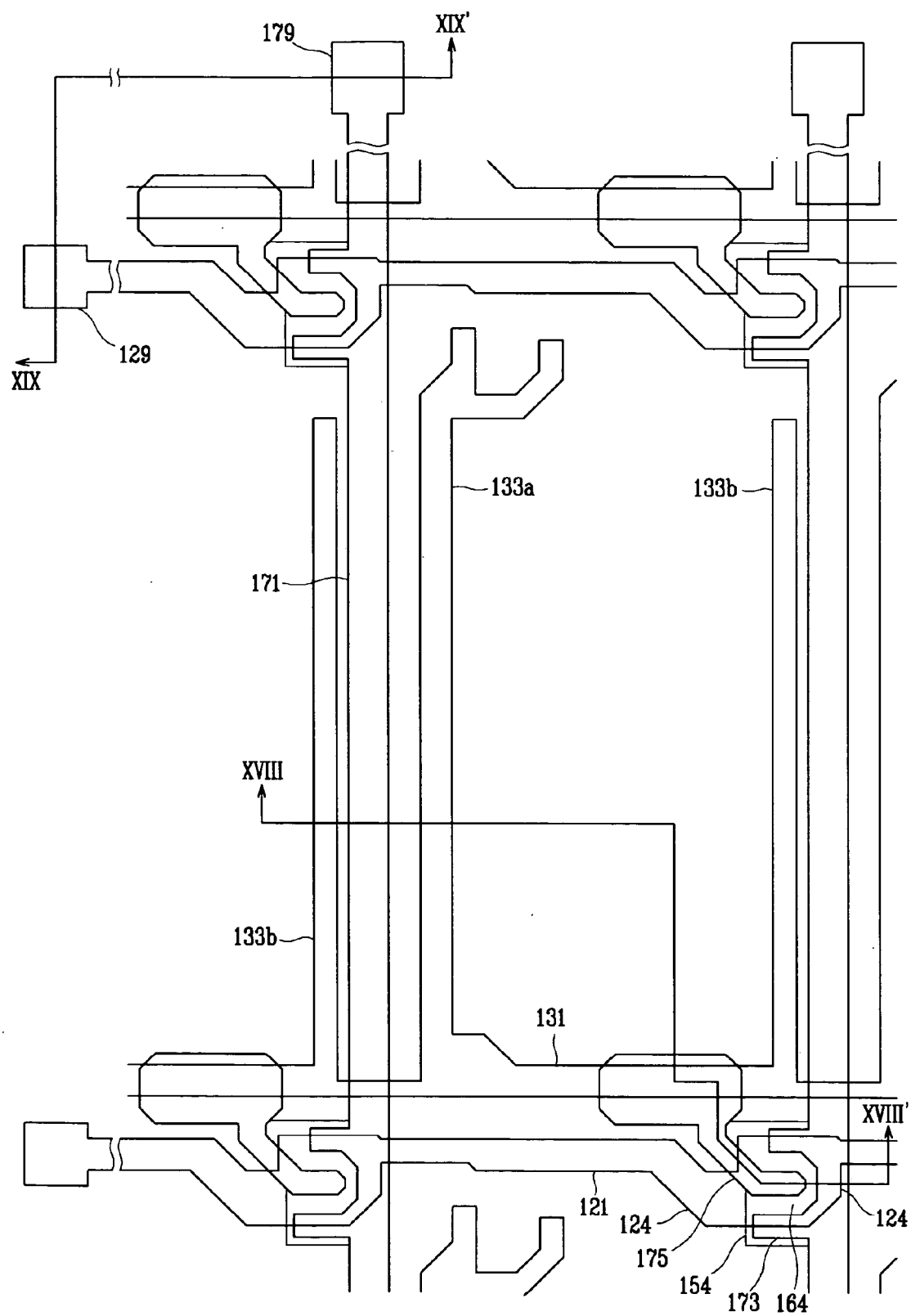
Figure 18:
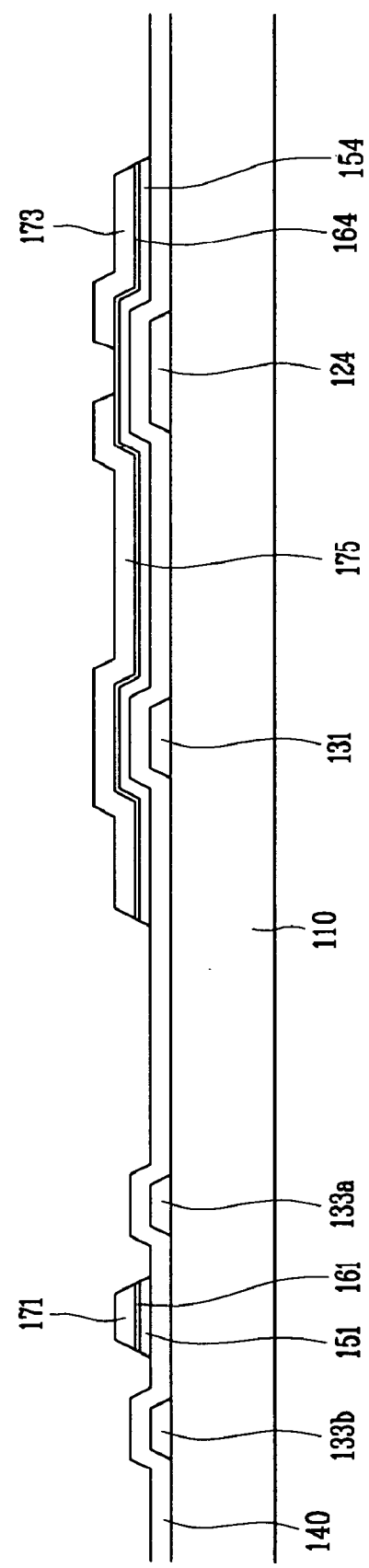
FIG. 18 and FIG. 19 are sectional views of the TFT array panel shown in FIG. 17 taken along line XVIII-XIIII' and line XIX-XIX', respectively.
Figure 19:
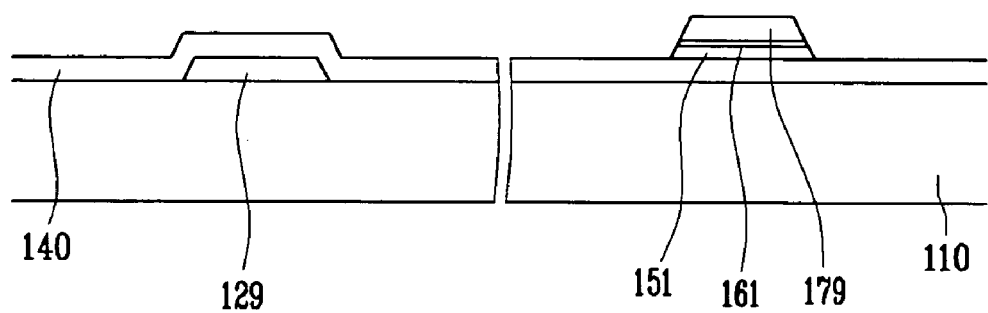
Figure 20:
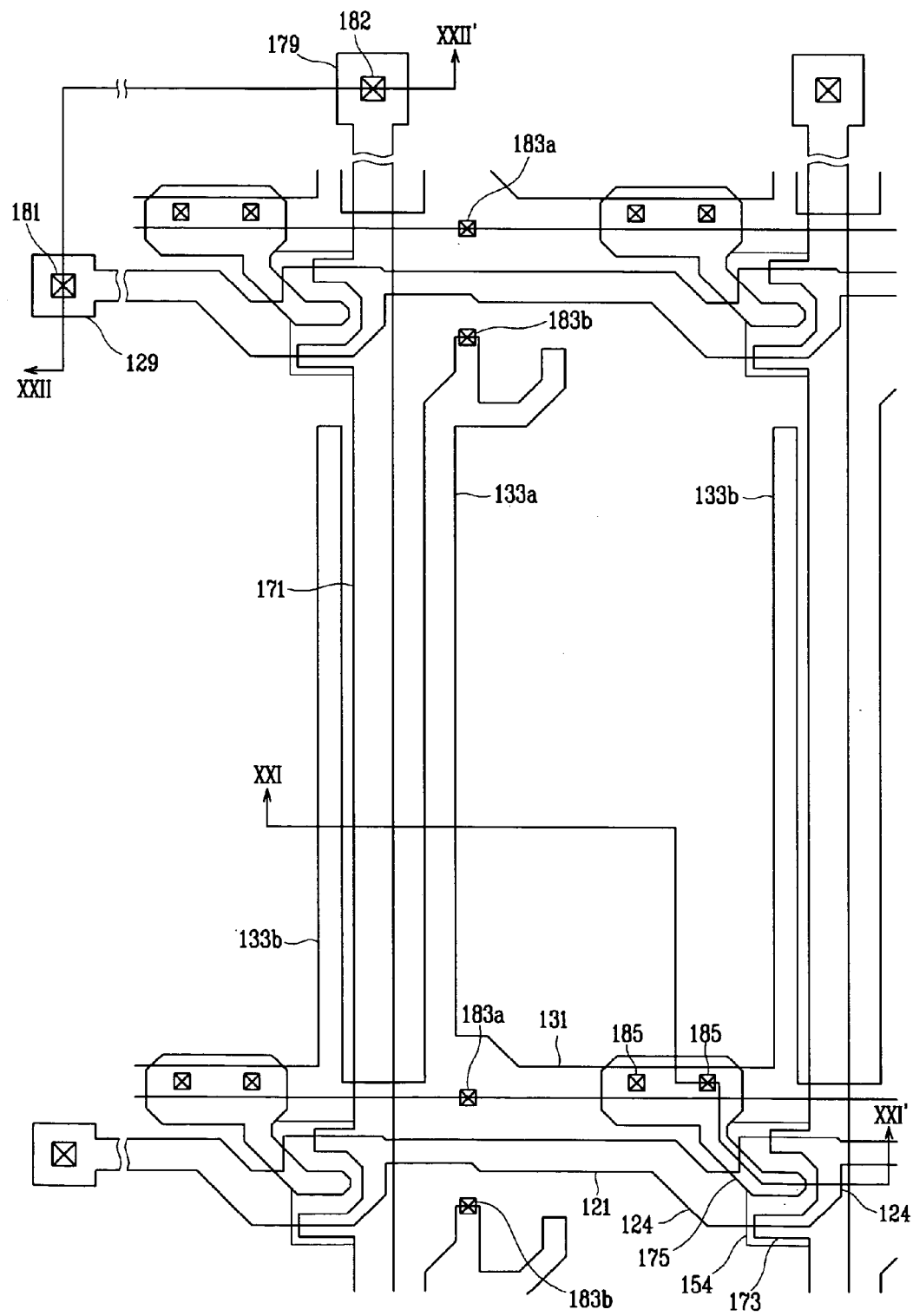
Figure 21:
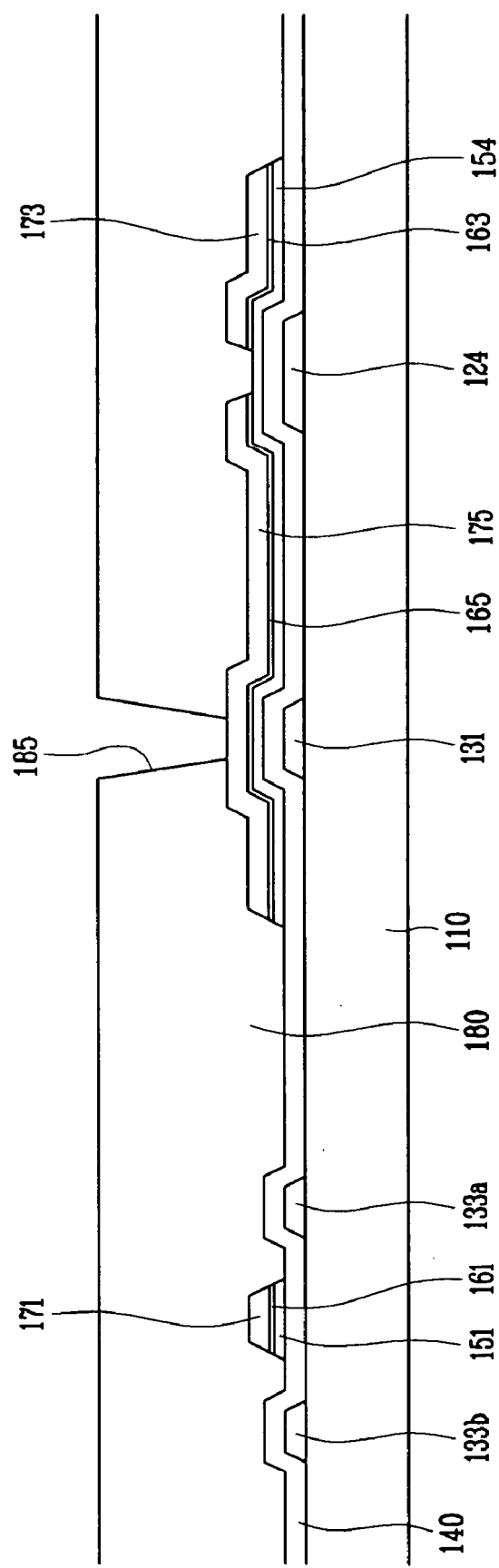
FIG. 21 and FIG. 22 are sectional views of the TFT array panel shown in FIG. 20 taken along line XXI-XXI' and line XXII-XXII', respectively.
Figure 22:
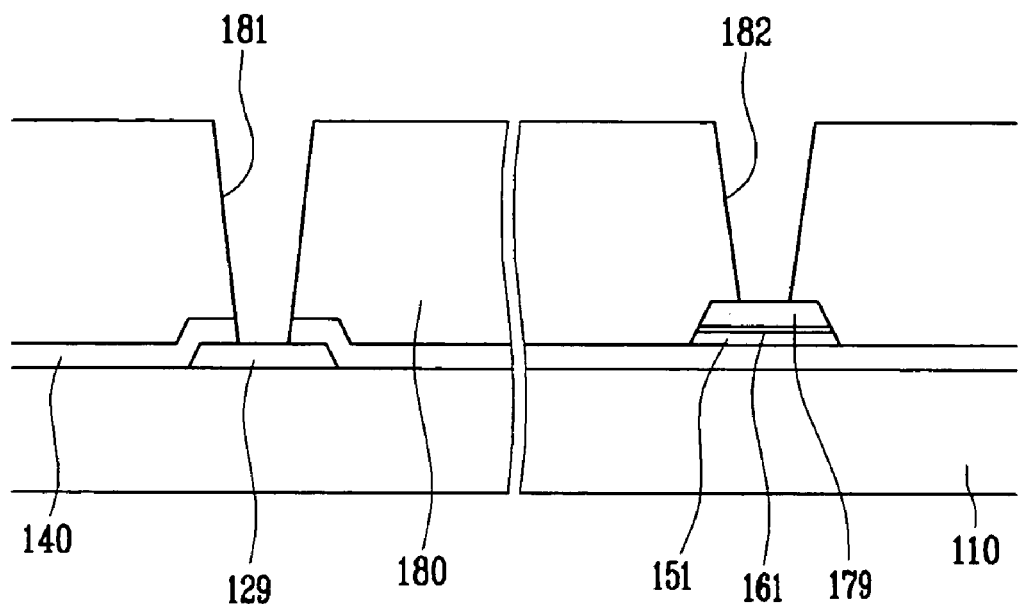

FIGS. 4, 17, and 20 are layout views of the TFT array panel in intermediate steps of a manufacturing method thereof according to embodiments of the present invention, FIGS. 5 and 6 are sectional views of the TFT array panel shown in FIG. 4 taken along the lines V-V' and VI-VI', respectively, FIGS. 7 to 16 are sectional views sequentially shown in a manufacturing method of a TFT array panel according to an embodiment of the present invention, FIGS. 18 and 19 are sectional views of the TFT array panel shown in FIG. 17 taken along the lines XVIII-XVIII' and XIX-XIX', respectively, and FIGS. 21 and 22 are sectional views of the TFT array panel shown in FIG. 20 taken along the lines XXI-XXI' and XXII-XXII', respectively.

As shown in FIGS. 4 to 6, a metal film including Mo is deposited on an insulating substrate 110. Next, the metal film is patterned by lithography and wet etching to form a plurality of gate lines 121 including gate electrodes 124 and end portions 129 and a plurality of storage electrode lines 131 including storage electrodes 133*a* and 133*b*.

Figure 7:
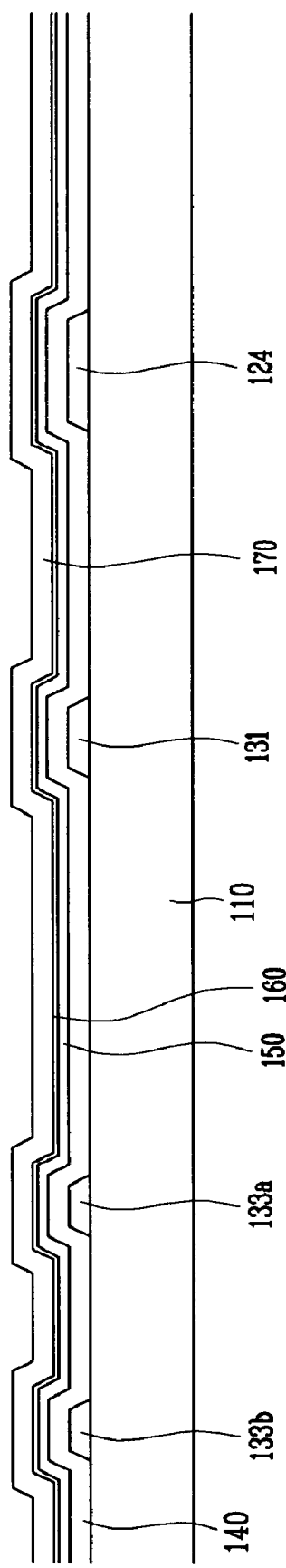
FIG. 7 to FIG. 16 are sectional views of the TFT array panel in steps of a manufacturing method thereof according to an embodiment of the present invention.
Figure 8:
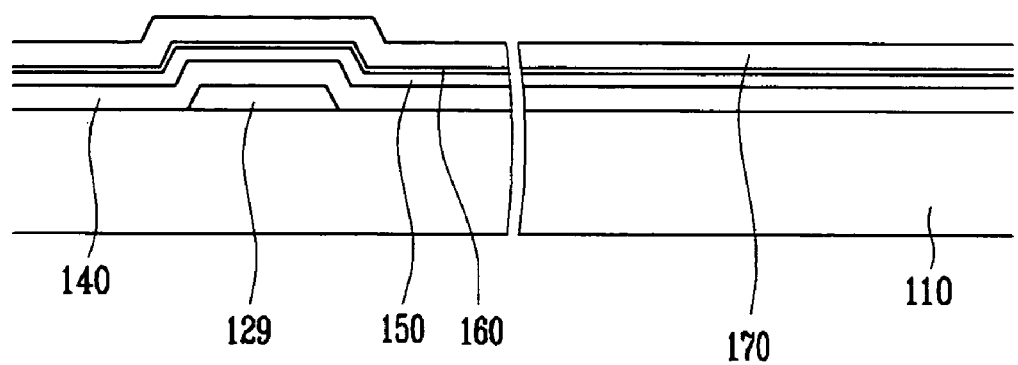

Referring to FIGS. 7 and 8, a gate insulating layer 140, an intrinsic a-Si layer 150, and an extrinsic a-Si layer 160 are sequentially deposited on the gate lines 121 and the storage electrode lines 131 by PECVD, etc. The intrinsic a-Si layer 150 may be made of hydrogenated amorphous silicon, and the extrinsic a-Si layer 160 may be made of n+ hydrogenated a-Si heavily doped with an n-type impurity such as phosphorous P. A conductive data layer 170 including Mo is deposited on the extrinsic a-Si layer 160 by sputtering, etc.

A photoresist composition is spin-coated on the data layer 170 to form a photoresist film. In accordance with an embodiment of the present invention, the photoresist composition may be obtained by dissolving a mixture including a novolac resin having a molecular weight of 3,000 obtained from a composition product of 60 parts by weight of m-cresol and 40 parts by weight of p-cresol and a photosensitive compound such as 20 parts by weight of 2,2'-methylene bis[6-(2-hydroxy-5-methyl phenyl)methyl]-4-methyl-1,2-naphtoquinonediazide-5-sulfonate in propylene glycol monomethylether acetate.

Figure 9:
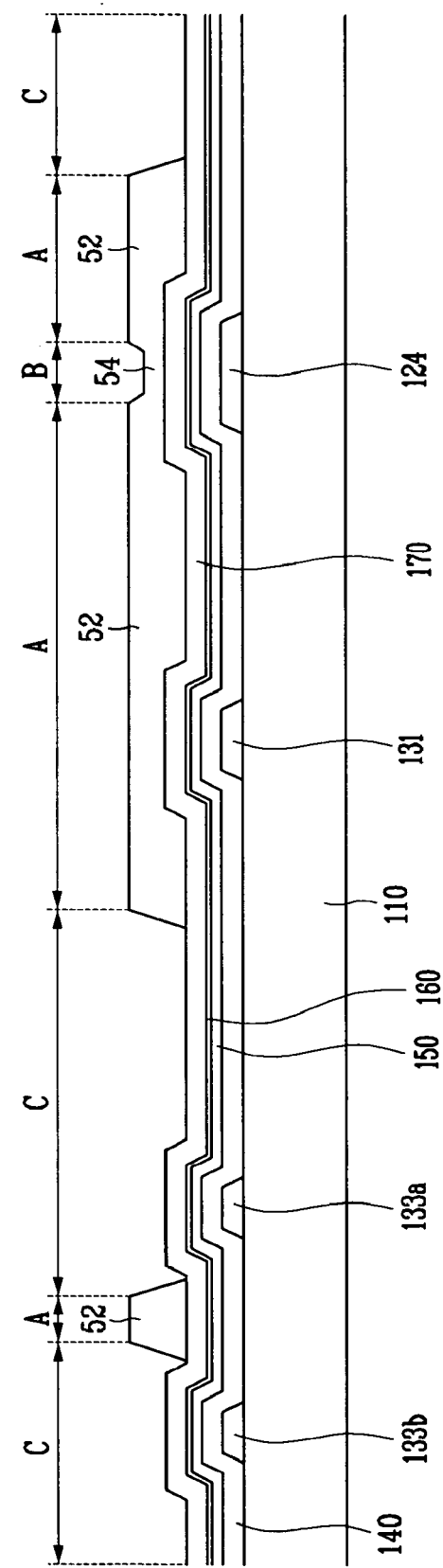
Figure 10:
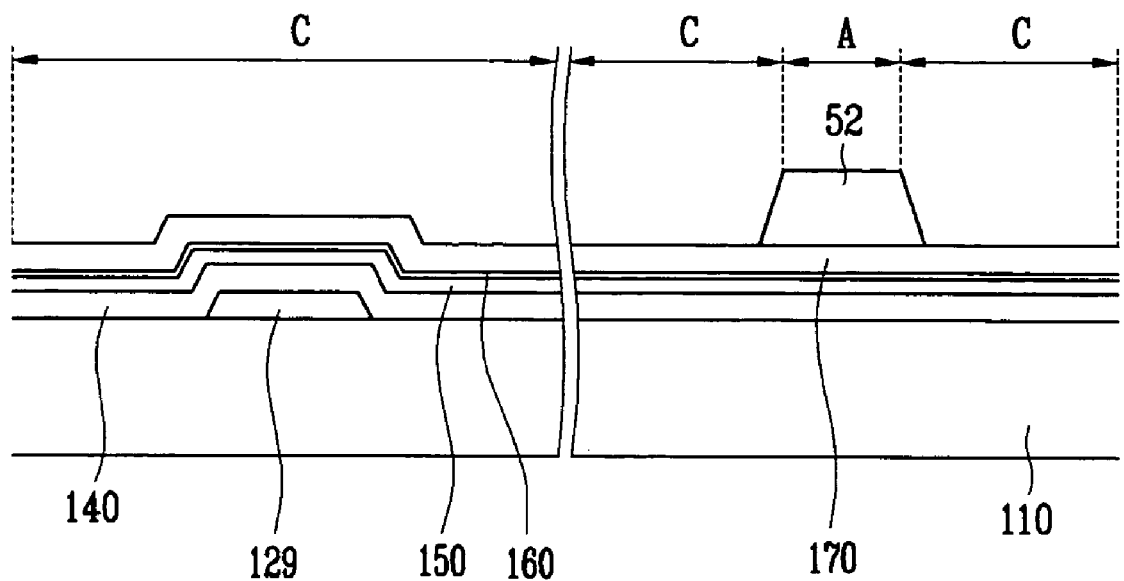

Referring to FIGS. 9 and 10, the photoresist film is exposed to light through a photo mask (not shown) and developed to form a photoresist including a plurality of first portions 52 and a plurality of second portions 54 having different thicknesses. The thickness of the first photoresist pattern 52 is greater than the thickness of the second photoresist pattern 54.

The photoresist 52 and 54 should not be subject to post baking, which may be generally performed for strongly adhering a photoresist to an underlying layer after development, since the post baking may cause the photoresist 52 and 54 to reflow such that the edge profile of the photoresist 52 and 54 is changed to cause unexpected patterns of the underlying layers, particularly in the channel portions of TFTs that will be formed in subsequent etching steps. The omission of the post baking in this embodiment is acceptable in this embodiment since the photoresist composition according to this embodiment has excellent adhesion.

For convenience, the intrinsic a-Si layer 150, the extrinsic a-Si layer 160, and the data layer 170 are supposed to have first portions, second portions, and third portions. The first portions are located on wire areas A, the second portions are located on channel areas B, and the third portions are located on the remaining areas C.

The first portions 52 of the photoresist are located on the data line areas A, and the second photoresist patterns 54 are located on the channel areas B. Here, a thickness ratio of the second photoresist patterns 54 to the first photoresist patterns 52 is adjusted depending upon the process conditions in the subsequent process steps. It is preferable that the thickness of the second photoresist patterns 54 is equal to or less than half of the thickness of the first photoresist patterns 52.

The position-dependent thickness of the photoresist patterns may be obtained by various techniques, for example by providing translucent areas on the photo mask as well as light transmitting transparent areas and light blocking opaque areas. The translucent areas may have a slit pattern, a lattice pattern, or a thin film(s) with intermediate transmittance or intermediate thickness. When using a slit pattern, it is preferable that the width of the slits or the distance between the slits is smaller than the resolution of a light exposer used for the photolithography.

Figure 11:
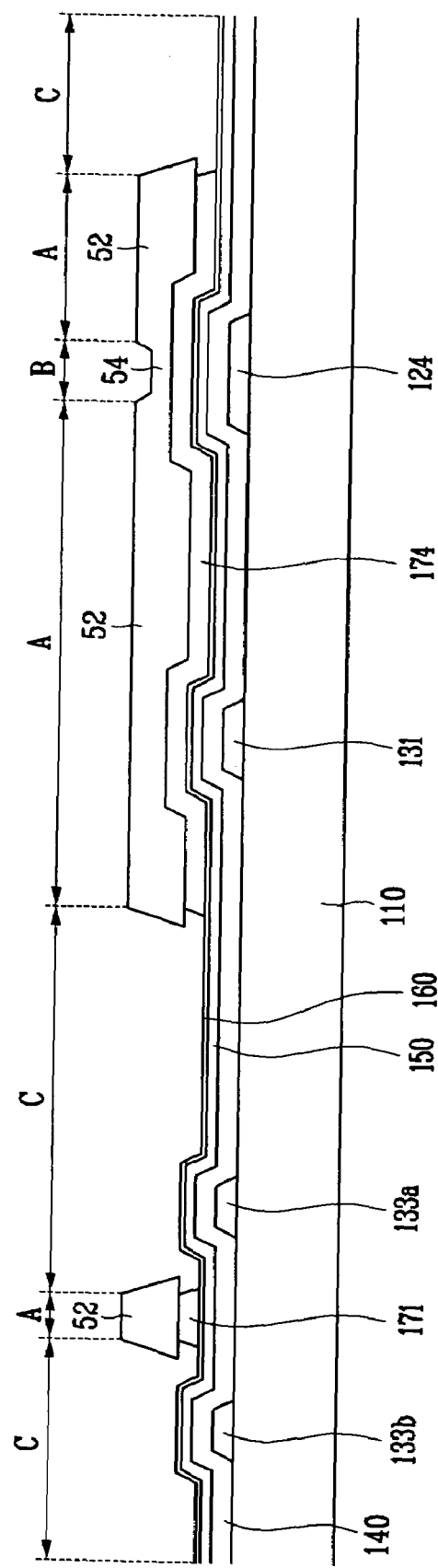
Figure 12:
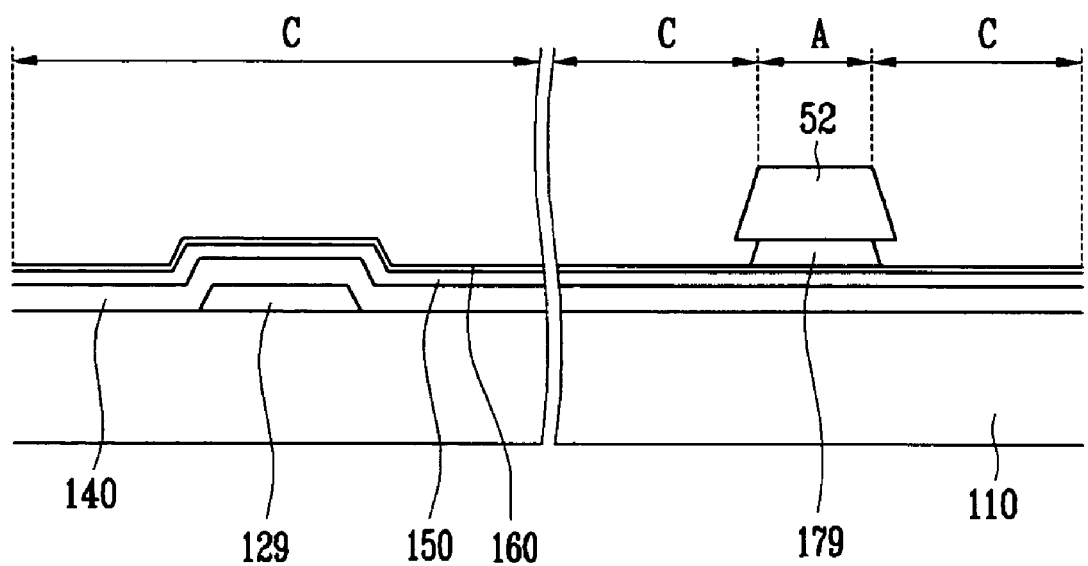

Referring to FIGS. 11 and 12, exposed portions of the data layer 170 located on the remaining areas C are removed by wet etching using the photoresist 52 and 54 as an etching mask to form a plurality of data conductors 174 on the data areas A and channel areas B.

Next, exposed portions of the extrinsic a-Si layer 160 and the underlying portions of the intrinsic a-Si layer 150 located on the remaining areas C are removed by dry etching using the data conductors 174 as an etching mask to form a plurality of extrinsic semiconductor stripes 164 and a plurality of (intrinsic) semiconductor stripes 151 including projections 154.

Figure 13:
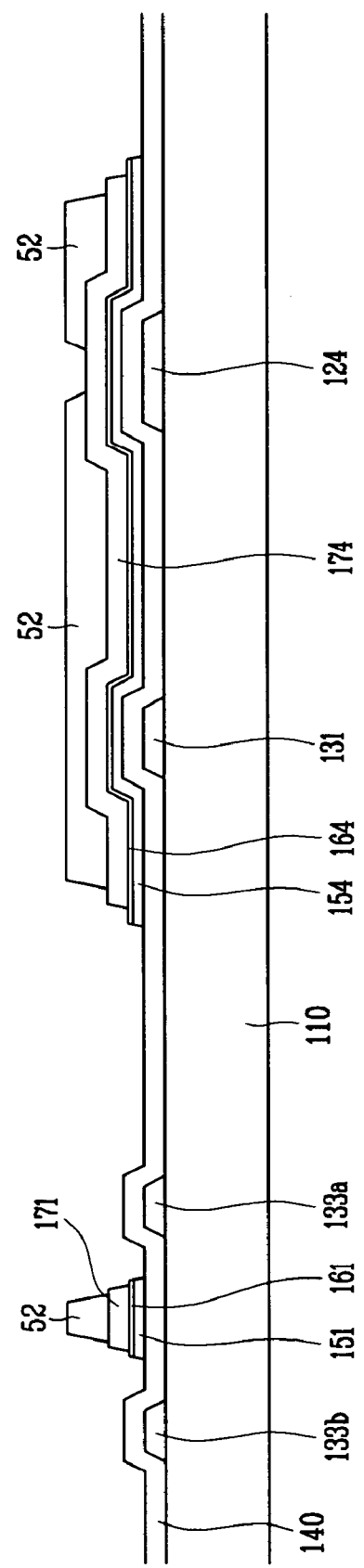
Figure 14:
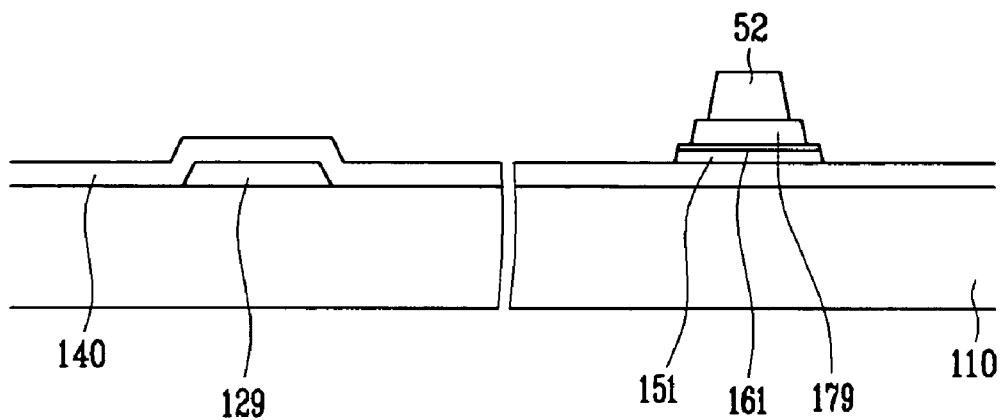

Next, the second portions 54 of the photoresist located on the channel areas B are removed by an etch-back process as shown in FIG. 13 and FIG. 14. At this time, the thickness of the photoresist pattern 52 is reduced by a predetermined amount. Also, edge portions of the first photoresist patterns 52 are removed to some degree to expose edge portions of the data patterns 171, 174, and 179.

Referring to FIGS. 15 and 16, heat-treatment is applied to the first photoresist patterns 52 at about 100° C. to about 150° C. to reflow the photoresist patterns 52.

Since the photoresist 52 includes a novolac resin having a low molecular weight, a photosensitive compound having a ballast structure, and an additive for modulating heat resistance, the photoresist 52 may easily reflow within the above-described temperature range. The reflow of the photoresist 52 forms a photoresist 52a that may cover the exposed portions of the data conductors 174 again.

Referring to FIGS. 17 to 19, using the photoresist 52a as an etching mask, the data patterns 174 are etched to form a plurality of data lines 171 including source electrodes 173 and a plurality of drain electrodes 175 spaced apart from the data lines 171, and to expose portions of the extrinsic semiconductor patterns 164 in the channel areas B between the source electrodes 173 and the drain electrodes 175.

Here, any of dry-etching and wet-etching may be used for patterning.

Since the edges of the photoresist 52 almost coincide with the edges of the data conductors 174, the dry etching will not yield over-etching of the data conductors 174. Since the photoresist 52a firmly adhere to the data patterns 171, 174, and 179, the extent of over-etching of the data conductors 174 caused by wet etching will be small. Next, the exposed portions of the extrinsic semiconductor patterns 164 in the channel areas are removed by dry etching.

Referring to FIGS. 20 to 22, a passivation layer 180 is deposited and patterned to form a plurality of contact holes 181, 182, 183a, 183b, and 185.

Finally, as shown in FIGS. 1 to 3, a transparent conducting material such ITO or IZO is deposited on the passivation layer 180 by sputtering, etc., and is patterned to form a plurality of pixel electrodes 191, a plurality of contact assistants 81 and 82, and a plurality of overpasses 83.

As described above, the photoresist compositions according to an embodiment of the present invention have low heat resistance and good adhesion to underlying layers, the method of manufacturing the TFT array panel according to an embodiment of the present invention method includes the heat-treatment process performed after an etch-back process, and accordingly the semiconductor layer located on the channel area may be uniformly etched and the exposed portions of the semiconductor layer may be decreased.

While this invention has been described in connection with what is presently considered to be practical exemplary embodiments, it is to be understood that the invention is not limited to the disclosed embodiments, but may cover various modifications and equivalent arrangements included within the spirit and scope of the appended claims.

What is claimed is:

1. A manufacturing method of a thin film transistor array panel, the method comprising:
   forming a gate line on a substrate;
   depositing a gate insulating layer, a semiconductor layer, and a data layer on the gate line;
   depositing a photoresist film on the data layer, the photoresist film comprising an alkali-soluble resin and a photosensitive compound having a ballast structure expressed by Chemical Formula (I),

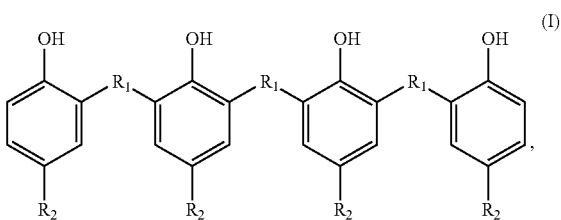

where $R_1$ and $R_2$ are alkyl groups, and $R_1$ and $R_2$ may be the same or different;

patterning the photoresist film to form a first photoresist;
etching the data layer using the photoresist pattern as an etching mask to form a data conductor;
etching the semiconductor layer using the data conductor as an etching mask;
applying heat-treatment for reflow to the photoresist pattern to form a second photoresist; and
etching the data conductor using the second photoresist as an etching mask.

2. The manufacturing method of a thin film transistor array panel of claim 1, wherein the photosensitive compound comprises a diazide group.

3. The manufacturing method of a thin film transistor array panel of claim 1, wherein the photosensitive compound comprises 2,2'-methylene bis[6-(2-hydroxy-5-methylphenyl)methyl]-4-methyl-1,2-naphtoquinonediazide-5-sulfonate.

4. The manufacturing method of a tin film transistor array panel of claim 3, wherein the photoresist film further comprises an additive for modulating heat resistance comprising a compound selected from the group consisting of a first compound expressed by Chemical Formula (II) and a second compound expressed by Chemical Formula (III):

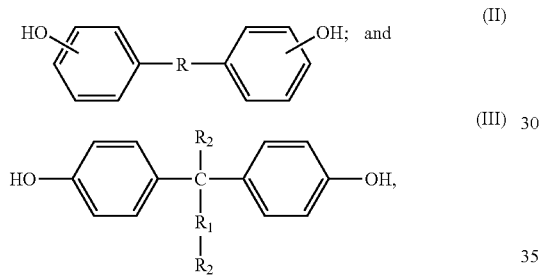

where R is a methyl group, an ethyl group, or a propyl group, $R_1$ is a methyl group, an ethyl group, a propyl group, a butyl group, a pentyl group, or a hexyl group, and $R_2$ is hydrogen (H) or a methyl group).

5. The manufacturing method of a thin film transistor array panel of claim 1, wherein applying heat-treatment to the photoresist pattern for reflow is performed at about 100° C. to about 150° C.

6. The manufacturing method of a thin film transistor array panel of claim 1, wherein the second photoresist covers edges of the data conductor.

7. The manufacturing method of a thin film transistor array panel of claim 1, further comprising:
performing an etch-back process after the etching of the semiconductor layer.

8. The manufacturing method of a thin film transistor array panel of claim 1, wherein the photoresist pattern comprises a first portion and a second portion thinner than the first portion.

9. The manufacturing method of a thin film transistor array panel of claim 1, wherein the patterning the photoresist film to form a photoresist pattern comprises:
light-exposing the photoresist film; and
developing the light-exposed photoresist film; wherein no heat-treatment occurs between the development of the light-exposed photoresist film and the etching of the data layer.

10. A manufacturing method of a thin film transistor array panel, the method comprising:
forming a gate line on a substrate;
depositing a gate insulating layer and a semiconductor layer;
depositing a data layer on the semiconductor layer;
depositing a photoresist film on the data layer;
light-exposing the photoresist film;
developing the photoresist film to form a photoresist having a first portion and a second portion having less thickness than the first portion;
first-etching the data layer using the patterned photoresist after the developing of the photoresist film;
etching the semiconductor layer using the first etched data layer as an etching mask;
applying heat-treatment for reflow to the photoresist; and
second-etching the data layer using the reflowing photoresist pattern as an etching mask,
wherein no heat treatment occurs between the developing the photoresist film and first-etching the data layer.

11. The manufacturing method of a thin film transistor array panel of claim 10, wherein the photoresist film comprises a photosensitive compound having a ballast structure expressed by Chemical Formula (I):

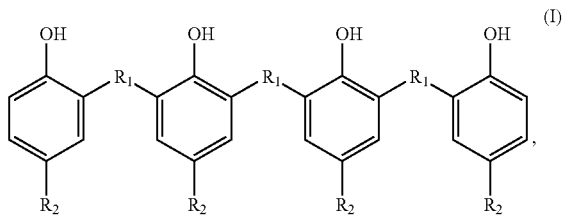

where $R_1$ and $R_2$ are alkyl groups, and $R_1$ and $R_2$ may be the same or different.

12. The manufacturing method of a thin film transistor array panel of claim 10, wherein the photoresist film comprises an additive for modulating heat resistance comprising a compound selected from the group consisting of a first compound expressed by Chemical Formula (II) and a second compound expressed by Chemical Formula (III);

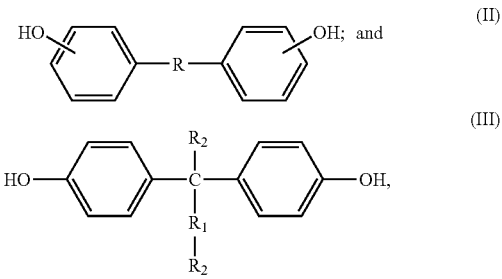

where R is a methyl group, an ethyl group, or a propyl group, $R_1$ is a methyl group, an ethyl group, a propyl group, a butyl group, a pentyl group, or a hexyl group, and $R_2$ is hydrogen (H) or a methyl group.

* * * * *